United States Patent
Lin et al.

(10) Patent No.: US 6,828,208 B2
(45) Date of Patent: Dec. 7, 2004

(54) METHOD OF FABRICATING SHALLOW TRENCH ISOLATION STRUCTURE

(75) Inventors: Tsung-De Lin, Hsinchu (TW);
Hsiao-Kang Wang, Hsinchu (TW);
Tian-Jue Hong, Hsinchu (TW);
Shih-Liang Chou, Hsinchu (TW);
Wen-Cheng Lien, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/248,538

(22) Filed: Jan. 28, 2003

(65) Prior Publication Data

US 2004/0147135 A1 Jul. 29, 2004

(51) Int. Cl.[7] .................. H01L 21/76; H01L 21/461
(52) U.S. Cl. .................. 438/400; 438/424; 438/435; 438/692; 438/717
(58) Field of Search ............... 438/400, 402, 438/424, 427, 692, 693, 717, 737, 425, 697, 700

(56) References Cited

U.S. PATENT DOCUMENTS 6,043,133 A * 3/2000 Jang et al. .................. 438/401
6,436,789 B2 * 8/2002 Sawamura .................. 438/424
6,531,265 B2 * 3/2003 Mei et al. .................. 430/314
6,638,866 B1 * 10/2003 Cheng et al. ............... 438/692

\* cited by examiner

Primary Examiner—Michael Lebentritt
(74) Attorney, Agent, or Firm—Jianq Chyun IP Office

(57) ABSTRACT

A method of fabricating a shallow trench isolation (STI) structure. A substrate is provided and then a pad oxide layer, a mask layer and a first trench are sequentially formed on the substrate. An insulation layer is formed inside the first trench and over the substrate. The insulation layer has a second trench in a location above the first trench. Thereafter, a conformal cap layer is formed over the insulation layer. The cap layer has a third trench in a location above the second trench. A reverse mask is formed over the cap layer covering the third trench. The cap layer and the insulation layer outside the reverse mask are removed to expose the upper surface of the mask layer. The reverse mask is removed and then the residual insulation layer outside the remaining cap layer and the trench are moved to expose the upper surface of the mask layer. Finally, the mask layer and the pad oxide layer are removed.

14 Claims, 5 Drawing Sheets

METHOD OF FABRICATING SHALLOW TRENCH ISOLATION STRUCTURE

BACKGROUND OF INVENTION

1. Field of Invention

The present invention relates to a method of fabricating an electrically insulating structure. More particularly, the present invention relates to a method of fabricating a shallow trench isolation (STI) structure.

2. Description of Related Art

Due to the rapid increase in the level of integration, design rules for fabricating semiconductor devices have decreased to a line width of about 0.18 μm or lower. Conventional electrical insulation structure such as silicon oxide layer can no longer be produced through a local oxidation (LOCOS) process. To produce viable electrical insulation to isolate devices, a method of fabricating shallow trench isolation structures has been developed.

A shallow trench isolation structure is conventionally fabricated by conducting a high-density plasma chemical vapor deposition (HDPCVD) process so that silicon oxide material is deposited into a trench. Since a HDPCVD process has a low degree of conformity, excessive amount of silicon oxide material has to be deposited and then chemical-mechanical polished to remove the excess material above the trench. However, density of distribution of the trenches on a substrate may vary. Due to differences in pattern density, material may be removed from regions with high trench density faster than other regions having a lower trench density. Ultimately, dishing of upper surface may occur in regions having a lower trench density leading to big variation in device reliability.

Conventionally, a reverse masking process is often used to resolve dishing problem. FIG. 1 is a schematic cross-sectional view of a substrate in a region with a sparse distribution of trenches. As shown in FIG. 1, a substrate 100 with a pad oxide layer 102, a mask layer 104 and a trench 106 thereon is provided. A high-density plasma chemical vapor deposition (HDPCVD) process is conducted to form a silicon oxide layer 108 to fill the trenches 106 and cover the mask layer 104. Thereafter, a photoresist layer (not shown) is formed over the silicon oxide layer 108. A yellow light processing is next conducted to form a pattern in the high-density regions and a reverse mask 114 in the low-density regions of the photoresist layer.

After patterning the photoresist layer, the silicon oxide layer 108 is etched using the photoresist layer and the reverse mask 114 as a mask until the upper surface of the mask layer 104 is exposed. Thereafter, the photoresist layer and the reverse mask 114 are removed so that the original low-density pattern region reverses into a high-density pattern region. A chemical-mechanical polishing operation is carried out to remove the silicon oxide layer until the upper surface of the silicon nitride layer is exposed. Finally, the silicon nitride layer and the pad oxide layer are removed to form a shallow trench isolation (STI) structure.

However, as devices continue to miniaturize, the aforementioned reverse masking process of fabricating shallow trench isolation structure is increasingly infeasible because of a narrowing of processing window. Moreover, any misalignment of the patterning mask may lead to the production of recesses 114. When the mask layer 104 is used as an etching stop layer in etching the silicon oxide layer 110, the recesses 114 may serve as entry points into the mask layer 104 so that the mask layer 104 may be etched through leading to over-etching. Consequently, the silicon substrate may be structurally damaged.

SUMMARY OF INVENTION

Accordingly, one object of the present invention is to provide a method of fabricating a shallow trench isolation (STI) structure that can increase the process window in the fabrication of a reverse mask using a yellow light processing.

A second object of this invention is to provide a method of fabricating a shallow trench isolation (STI) structure that can prevent any damage to an underlying silicon substrate due to over-etching in an insulation layer etching process.

To achieve these and other advantages and in accordance with the purpose of the invention, as embodied and broadly described herein, the invention provides a method of fabricating a shallow trench isolation (STI) structure. A substrate is provided and then a pad oxide layer, a mask layer and a first trench are sequentially formed on the substrate. An insulation layer is formed inside the first trench and over the substrate. The insulation layer has a second trench in a location above the first trench. Thereafter, a conformal cap layer is formed over the insulation layer. The cap layer has a third trench in a location above the second trench and the third trench has a width smaller than the second trench. A reverse mask is formed over the cap layer covering the third trench. The cap layer and the insulation layer outside the reverse mask are removed to expose the upper surface of the mask layer. The reverse mask is removed and then the residual insulation layer outside the remaining cap layer and the trench are removed to expose the upper surface of the mask layer. Finally, the mask layer and the pad oxide layer are removed.

In this invention, a conformal cap layer is formed over the insulation layer. Hence, width of the trench above the insulation layer is reduced through the trench formed in the cap layer. Consequently, process window for fabricating a reverse mask over the trench is increased. Hence, the reverse mask is able to cover the trench entirely and prevents the formation of a recess at the junctions between the reverse mask and the trench.

Furthermore, in the absence of recess at the junction between the reverse mask and the trench, the process of etching the insulation layer is able to stop right at the interface with the mask layer. Since over-etching through recesses is prevented, the underlying silicon substrate is saved from any harmful effects.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
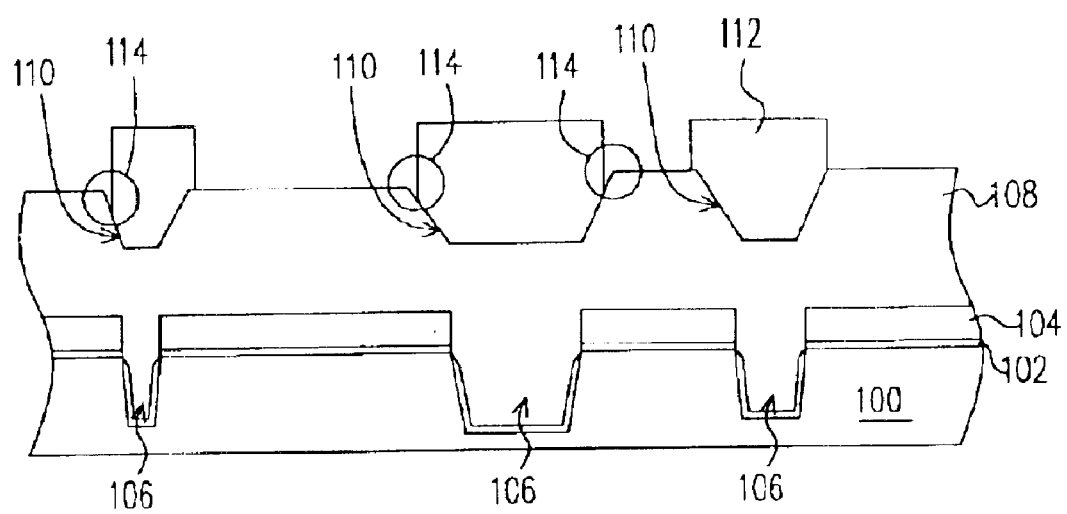
FIG. 1 is a schematic cross-sectional view of a substrate in a region with a sparse distribution of trenches.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
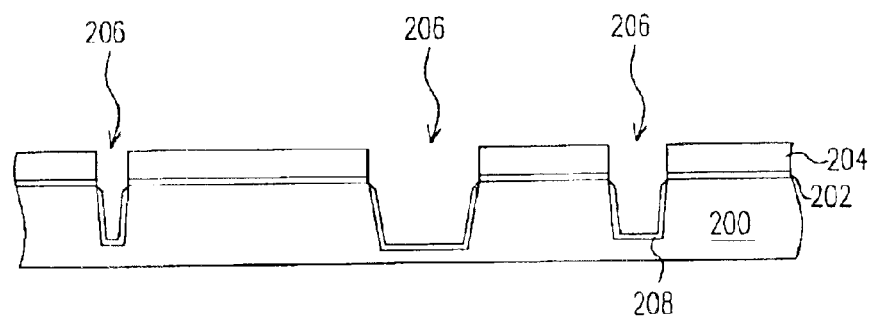
FIGS. 2A through 2G are schematic cross-sectional view showing the progression of steps for fabricating shallow trench isolation structures on a substrate according to one preferred embodiment of this invention.

FIGS. 2A through 2G are schematic cross-sectional view showing the progression of steps for fabricating shallow trench isolation structures on a substrate according to one preferred embodiment of this invention. As shown in FIG. 2A, a semiconductor substrate 200 is provided. A pad oxide layer 202 and a mask layer 204 are sequentially formed over the substrate 200. The pad oxide layer 202 is formed, for example, by conducting a thermal oxidation. The mask layer 204 is a silicon nitride layer formed, for example, by conducting a chemical vapor deposition (CVD). Thereafter, a portion of the mask layer 204, the pad oxide layer 202 and the substrate 200 are removed to form trenches 206. The trenches 206 are formed, for example, by forming a patterned photoresist layer (not shown) over the mask layer and then conducting an anisotropic etching to remove the mask layer 204, the pad oxide layer 202 and a portion of the substrate 200. A liner layer 208 is formed on the interior surface of the trenches 206. The liner layer 208 is a silicon oxide layer formed, for example, by conducting a thermal oxidation.

Figure 2B:
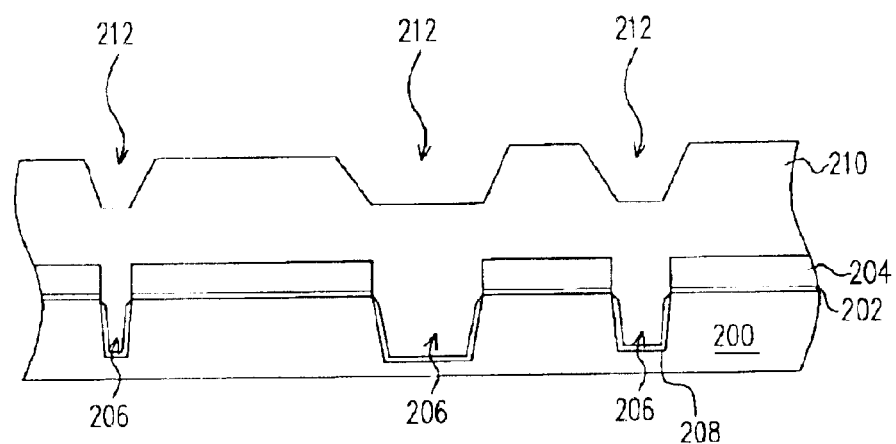

As shown in FIG. 2B, an insulation layer 210 is formed inside the trenches 206 and over the entire substrate 200. The insulation layer 210 is a silicon oxide layer formed, for example, by conducting a high-density plasma chemical vapor deposition (HDPCVD) using reactive gases including silane ($SiH_4$), oxygen ($O_2$) and argon (Ar). Since HDPCVD has a poor conformity, a trench 212 is formed in the insulation layer 210 above which the trench 206 is located.

Figure 2C:
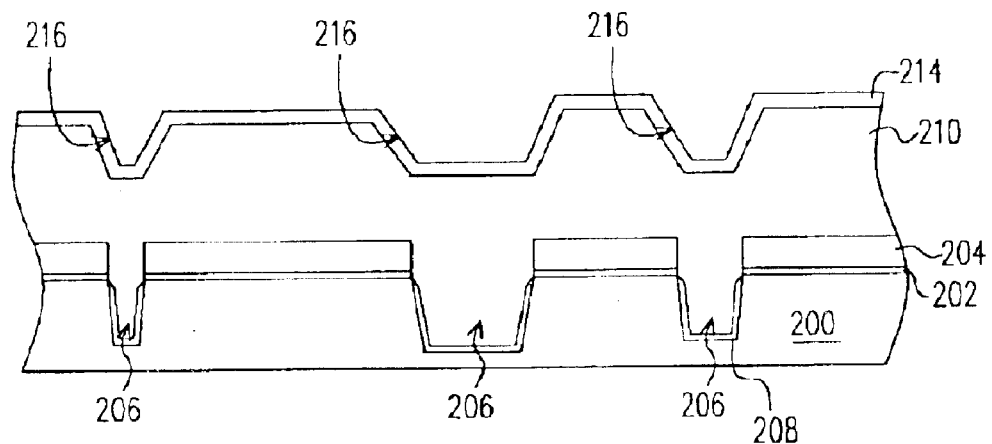

As shown in FIG. 2C, a thin cap layer 214 is formed over the insulation layer 210 globally. The cap layer 214 forms trenches 216 in positions where the trenches 212 in the insulation layer 210 are located. Width of the trench 216 is smaller than the trench 212. The cap layer 214 is a conformal silicon dioxide layer over the insulation layer 210 formed, for example, by conducting a chemical vapor deposition. The cap layer 214 may form inside the same deposition chamber as the insulation layer 210. For example, by turning off the radio frequency bias voltage applied to the wafer in the HDPCVD, a conformal cap layer is able to form over the insulation layer 210. Nevertheless, this invention has no restriction on the type of depositing station used for fabricating the cap layer 214. Another depositing station instead of the same depositing station may be used.

Figure 2D:
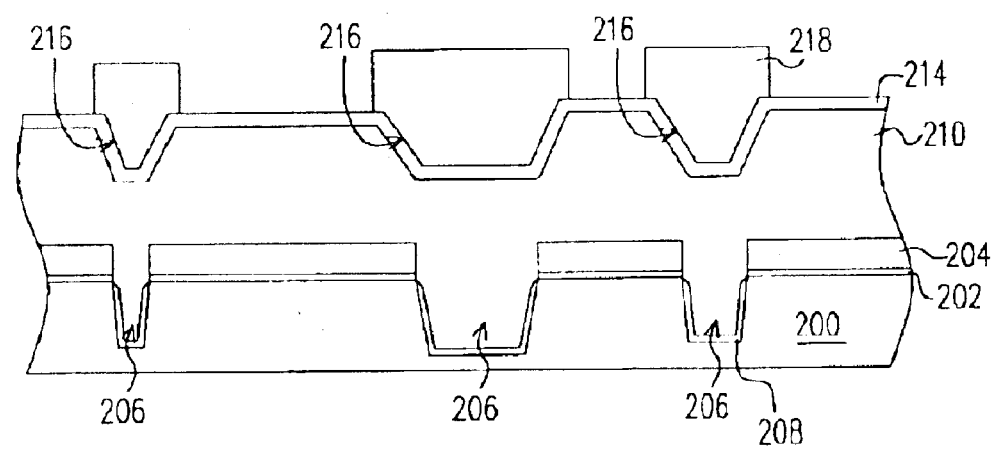

As shown in FIG. 2D, a patterned mask layer 218 is formed over the cap layer 214 to serve as a reverse mask. The mask layer 218 must have a width greater than the upper portion of each trench 216 so that the trenches 216 are completely covered. The mask layer 218 is a photoresist layer formed, for example, by deposition photoresist material over the cap layer 214 to form a photoresist layer (not shown) and then developing the photoresist layer after photo-exposing the photoresist material. Since the trenches 216 formed on the cap layer 214 as shown in FIG. 2C is able to reduce width of the original trench 212, the mask layer 218 can have a wider process window. Hence, the mask layer 218 can easily cover the trenches 216 without producing any recesses at their junctions.

Figure 2E:
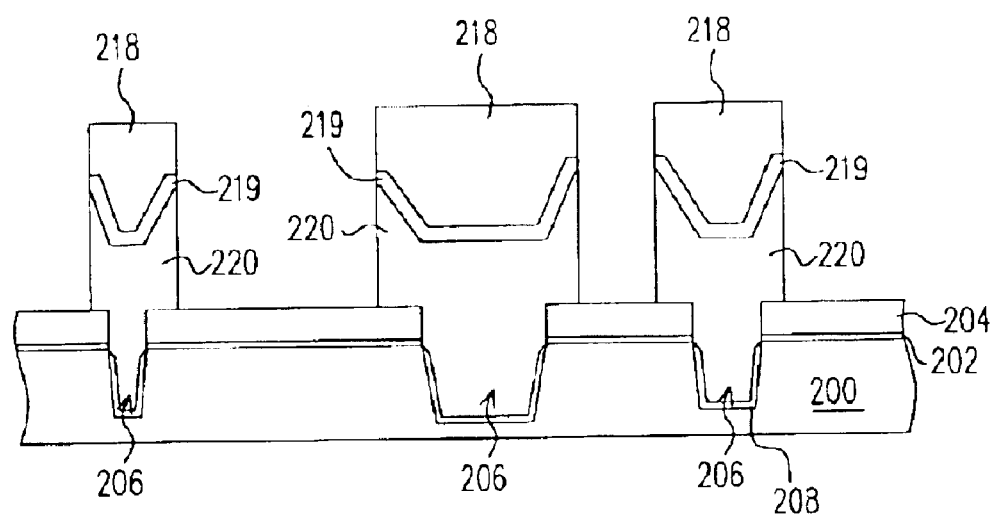

As shown in FIG. 2E, the cap layer 214 and the insulation layer 210 outside the mask layer 218 is removed to expose the upper surface of the mask layer 204 and form a cap layer 219 and an insulation layer 220. The cap layer 214 and the insulation layer 210 are removed, for example, by conducting an anisotropic etching of the cap layer 214 and the insulation layer 210 suing the mask layer 218 as an etching mask and the mask layer 204 as an etching stop layer. Since no recess is formed at the junctions between the reverse mask 218 and the trenches 216, the etching process is able to stop right at the interface with the mask layer 204 and prevents any damage to the underlying substrate 200.

Figure 2F:
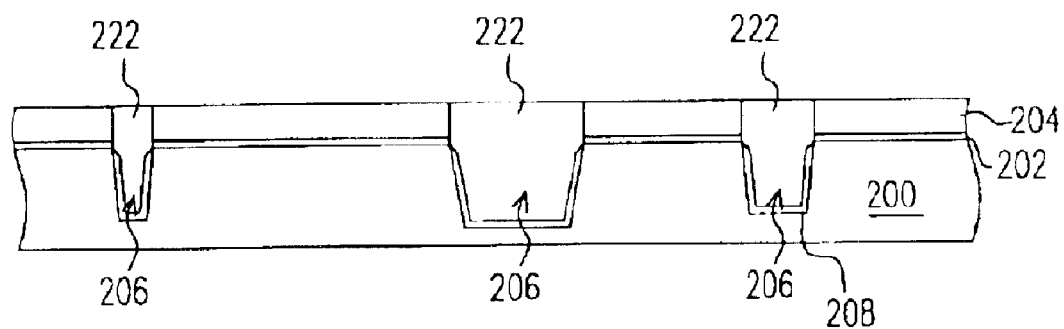

As shown in FIG. 2F, the mask layer 218 above the cap layer 219 is removed. Thereafter, the cap layer 219 and the insulation layer 220 outside the trenches 206 are removed to expose the upper surface of the mask layer 204 and form a planar surface with insulation plugs 222 inside the trenches 206. The cap layer 219 and portion of the insulation layer 210 are removed, for example, by conducting a chemical-mechanical polishing using the mask layer 204 as a polishing stop layer.

Figure 2G:
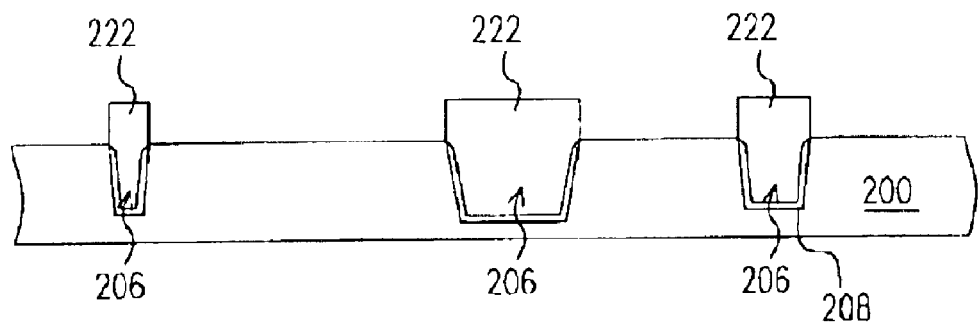

As shown in FIG. 2G, the mask layer 204 and the pad oxide layer 202 are sequentially removed to form shallow trench isolation structures on the substrate 200. The mask layer 204 is removed, for example, by conducting a wet etching using hot phosphoric acid solution. The pad oxide layer 202 is removed, for example, by conducting a wet etching using hydrofluoric acid (HF) solution.

In conclusion, major advantages of this invention include:

1. In this invention, a conformal cap layer is formed over the insulation layer so that width of the trench above the insulation layer is reduced through the trench formed in the cap layer. Consequently, process window for fabricating a reverse mask over the trench is increased. Hence, even if there is some misalignment in the process, the reverse mask is able to cover the trench entirely and prevents the formation of a recess at the junctions between the reverse mask and the trench.

2. In the absence of recess at the junction between the reverse mask and the trench, the process of etching the insulation layer is able to stop right at the interface with the mask layer. The prevention of over-etching through recesses saves the underlying silicon substrate from any harmful effects.

3. The method can be implemented with ease and can be applied to the process of fabricating an insulating film inside a shallow trench isolation structure. Hence, the method is able to increase the process window for fabricating a reverse mask through a yellow light process without introducing any difficult steps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation structure, comprising the steps of:

providing a substrate;

sequentially forming a pad oxide layer, a mask layer and a first trench on the substrate;

forming an insulating layer inside the first trench and over the substrate such that the insulating layer has a second trench above the first trench;

forming a conformal cap layer over the insulating layer such that the conformal cap layer has a third trench above the second trench, wherein material constituting the cap layer includes silicon oxide;

forming a reverse mask over the cap layer and covering the third trench;

removing the cap layer and the insulating layer outside the reverse mask to expose the upper surface of the mask layer;

removing the reverse mask;

removing any residual insulating layer outside the cap layer and the trench to expose the upper surface of the mask layer; and removing the mask layer and the pad oxide layer.

2. The method of claim 1, wherein the cap layer is formed by conducting a chemical vapor deposition.

3. The method of claim 1, wherein the insulating layer is a silicon oxide layer formed conducting a high-density plasma chemical vapor deposition.

4. The method of claim 1, wherein the cap layer and the insulating layer are formed in the same reaction chamber.

5. The method of claim 1, wherein material constituting the reverse mask includes a photoresist material.

6. The method of claim 1, wherein the step of removing the residual insulating layer outside the cap layer and the trench to expose the upper surface of the mask layer includes chemical-mechanical polishing.

7. The method of claim 1, wherein before the step of forming the insulating layer inside the trench and over the substrate, further includes forming a liner layer on the interior surface of the trench.

8. A method of fabricating a shallow trench isolation structure, comprising the steps of:

providing a substrate;

sequentially forming a pad oxide layer, a mask layer and a first trench on the substrate;

forming an insulating layer inside the first trench and over the substrate such that the insulating layer has a second trench above the first trench;

forming a cap layer over the insulating layer such that the cap layer has a third trench above the second trench, wherein the third trench has a width smaller than the second trench, and material constituting the cap layer includes silicon oxide;

forming a reverse mask over the cap layer and covering the third trench;

removing the cap layer and the insulating layer outside the reverse mask to expose the upper surface of the mask layer;

removing the reverse mask;

removing any residual insulating layer outside the cap layer and the trench to expose the upper surface of the mask layer; and removing the mask layer and the pad oxide layer.

9. The method of claim 8, wherein the cap layer is formed by conducting a chemical vapor deposition.

10. The method of claim 8, wherein the insulating layer is a silicon oxide layer formed by conducting a high-density plasma chemical vapor deposition.

11. The method of claim 8, wherein the cap layer and the insulating layer are formed in the same reaction chamber.

12. The method of claim 8, wherein material constituting the reverse mask includes a photoresist material.

13. The method of claim 8, wherein the step of removing the residual insulating layer outside the cap layer and the trench to expose the upper surface of the mask layer includes chemical-mechanical polishing.

14. The method of claim 8, wherein before the step of forming the insulating layer inside the trench and over the substrate, further includes forming a liner layer on the interior surface of the trench.

* * * * *